United States Patent [19]
Carlson

[11] 3,792,359
[45] Feb. 12, 1974

[54] HIGH FREQUENCY AUTOMATIC GAIN CONTROL CIRCUITS

[75] Inventor: David John Carlson, Indianapolis, Ind.

[73] Assignee: RCA Corporation, New York, N.Y.

[22] Filed: Apr. 14, 1971

[21] Appl. No.: 133,806

[52] U.S. Cl. .................. 325/319, 325/381, 325/387, 325/410, 330/130

[51] Int. Cl. .......................... H04b 1/16, H04b 1/18

[58] Field of Search ... 325/319, 381, 387, 400, 410, 325/414, 408, 411; 330/29, 130, 22, 40

[56] References Cited

UNITED STATES PATENTS

| | | | |
|---|---|---|---|
| 2,941,070 | 6/1960 | Barry | 325/319 |
| 3,126,514 | 3/1964 | Germain et al. | 325/319 |
| 3,622,887 | 11/1971 | Byles | 325/381 |
| 3,072,849 | 1/1963 | Firestone | 325/319 |
| 3,110,864 | 11/1963 | Smith-Vaniz et al. | 325/319 |
| 3,061,785 | 10/1962 | Battin | 330/29 |
| 3,613,008 | 10/1971 | Jabbar | 325/319 |
| 3,035,170 | 5/1962 | Webster | 325/319 |

FOREIGN PATENTS OR APPLICATIONS

| | | | |
|---|---|---|---|
| 846,131 | 8/1960 | Great Britain | 325/319 |

*Primary Examiner*—Robert L. Griffin
*Assistant Examiner*—Jin F. Ng
*Attorney, Agent, or Firm*—Eugene M. Whitacre

[57] ABSTRACT

A common base amplifier used for high frequency amplification has an automatic gain control voltage applied thereto to vary the gain in a reverse mode. As the gain of the transistor is decreased, a unilateral current conduction device, coupled to the emitter electrode or input of the amplifier, is caused to conduct. The conduction of the unilateral device causes the voltages between the electrodes of the amplifier to remain constant, while further causing additional impedance shunting of the transistor to maintain the input impedance of the amplifier relatively constant during AGC operation.

8 Claims, 2 Drawing Figures

INVENTOR.
David J. Carlson
BY [signature]
ATTORNEY

INVENTOR.
David J. Carlson
BY
ATTORNEY

HIGH FREQUENCY AUTOMATIC GAIN CONTROL CIRCUITS

This invention relates to high frequency amplifiers and, more particularly, to a gain controllable high frequency amplifier.

It is well known that, in order to provide optimum response in a television or radio receiver, it is necessary to provide a means of controlling the gain of an amplifier in the RF or IF sections to permit the receiver to handle a larger range of dynamic signal changes. There are many prior art circuits which utilize bias control of the RF or IF device in such a manner as to vary the transconductance and therefore the gain of such devices. Furthermore, when utilizing bipolar transistors at relatively high frequencies, it has also been known that by using a forward bias or a forward AGC approach, one can minimize the tendency of the device to provide spurious responses. The forward AGC bias mode requires additional power and hence is not easily utilized with integrated circuit technology. This is so as, in order to provide such a control voltage, increased power dissipation would be necessary.

Besides the above considerations, there is an additional requirement in such receivers for proper impedance termination. For example, the IF signal frequency is usually derived in a conventional receiver from a mixer device which responds to the RF signal and the local oscillator signal to produce a sum or difference frequency signal which is the IF. This signal is then usually amplified by means of an IF amplifier whose gain may also be controlled to provide still a greater dynamic-range, signal operation. In such systems the mixer usually has to be optimumly terminated in order to provide a uniform efficiency of mixing over the entire band of operation of the receiver. There are certain techniques in the prior art which recognize the need for properly terminating the mixer. However, when one utilizes AGC in conjunction with the IF amplifier, it has been found that due to the impedance variations of the transistor or active device during the AGC mode, the termination of the mixer will be affected, thereby disturbing the overall response.

According to an embodiment of the present invention, there is disclosed a high frequency amplifier which is responsive to an AGC voltage applied to the same. Means including a unilateral current conducting device serve to maintain the termination representative of the input impedance of the amplifier constant during AGC.

This characteristic can be utilized to advantage in an IF amplifier configuration, as will be explained by reference to the following specification when read in conjunction with the accompanying drawings, in which.

Figure 1:
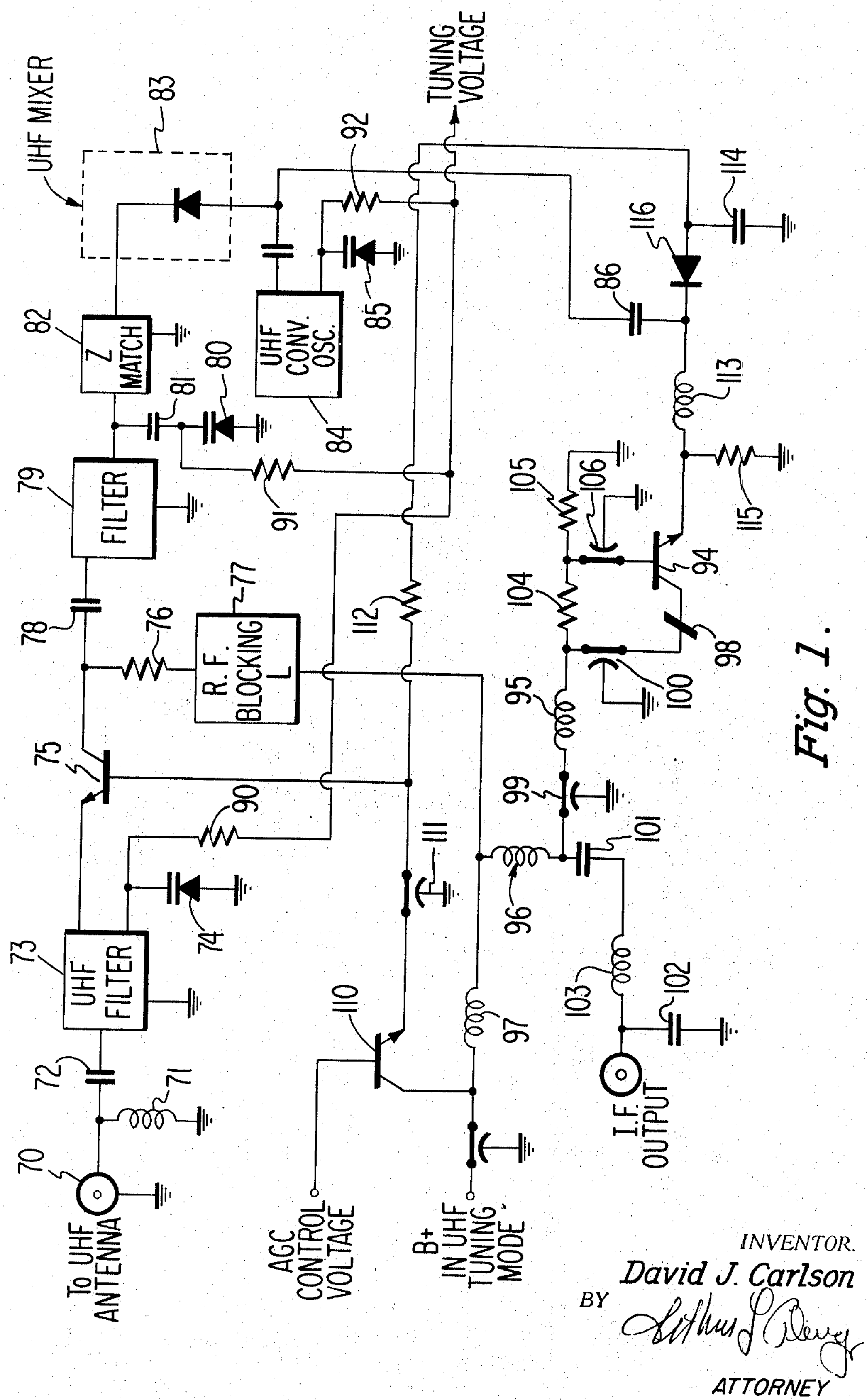
FIG. 1 is a schematic diagram partially in block form of an ultra high frequency (UHF) tuner incorporating an IF amplifier according to this invention.

FIG. 1 shows an input terminal 70 for coupling to the suitable UHF antenna. The UHF antenna is one capable of responding to the 70 channels presently allocated in the UHF television band. The terminal 70 is connected to a point of reference potential via an inductor 71 which serves as an impedance terminating element for the UHF antenna. A capacitor 72 applies UHF signal frequencies to a UHF filter 73 which can be tuned by means of a varactor diode 74.

The output of filter 73 is coupled to the emitter input electrode of a common base bipolar amplifier transistor 75. This stage provides voltage gain for the UHF frequencies applied to the emitter electrode. The collector electrode of transistor 75 is coupled to a source of operating potential (B+) via an RF isolating network including resistor 76 and RF blocking inductor 77, serially coupled to a further inductor 97.

The amplified UHF output signal taken at the collector electrode of transistor 75 is applied via a capacitor 78 to the input of a UHF filter network 79. The filter 79 is also tunable and, for the UHF frequency band, may be comprised of transmission line elements. Tuning of the filter 79 is accomplished by means of the associated varactor diode 80 in series with capacitor 81, coupling its output to ground.

The filtered UHF signal frequencies available at the output of filter 79 are applied through an impedance matching network 82 to an electrode of a UHF mixing diode circuit 83. Another input to the mixing diode 83 is obtained from the output of a UHF conversion oscillator 84. Oscillator 84 which tracks with UHF tuning is tuned by means of a varactor diode 85. The difference in frequency between the UHF signal and the oscillator 84 signal is approximately equal to the video IF signal. The commonality of tuning is shown by the common coupling of an applied tuning voltage to the varactors 74, 80 and 85 by resistors 90, 91 and 92, respectively. It is of course understood that more varactors can be used as well to provide greater tuning capability.

The output of the mixer diode 83 is applied via a capacitor 86 to the emitter electrode input of UHF IF amplifier circuit including a transistor 94 arranged in a common base configuration. The collector electrode of transistor 94 receives operating bias from the B+ line via inductors 95, 96 and 97. A ferrite bead 98 surrounds the collector lead of transistor 94 and serves to prevent spurious oscillations. The collector circuit of transistor 94 also includes feedthrough capacitors 99 and 100 and an output tank configuration of capacitors 101, 102 and inductor 103. These elements, in conjunction with the above-mentioned collector components, provide selectivity and impedance matching for the video IF signal developed by the UHF tuner. The base electrode of transistor 94 is biased via resistors 104 and 105 and is bypassed to ground for AC signals via capacitor 106. The emitter electrode of transistor 94 is coupled to the mixer diode 83 via capacitor 86 in series with inductor 113. The junction between the emitter electrode and inductor 113 is returned to ground via resistor 115.

The AGC control voltage is applied to the base electrode of a transistor 110 arranged in a common collector configuration. The collector electrode of transistor 110 is returned to the B+ supply and the emitter electrode is coupled via a feedthrough capacitor 111 to the base electrode of the UHF RF amplifier transistor 75. The emitter electrode of transistor 110 is further coupled via a resistor 112 to the anode of a diode 116 whose cathode is coupled to the junction between capacitor 86 and inductor 113. The anode of diode 116 is returned to ground for AC signals via a capacitor 114.

It is known that the output impedance of the diode 83 in a mixer varies according to the amount of oscillator signal applied or injected into the diode. The variation of diode impedance affects the conversion efficiency of the diode mixer and hence adversely affects the amplitude of the output IF signal available. This effect is compensated for by returning the anode of the mixer diode 83 to the low input impedance available at the emitter electrode of transistor 94. The coupling is accomplished by means of capacitor 86 and inductor 113.

The low input impedance termination afforded by the common base transistor amplifier 94 therefore serves to reduce the effect of impedance changes on the diode 83. However, transistor 94 is gain controlled by means of the diode 116 having its anode coupled to the emitter electrode of the follower transistor 110. Operation of the circuit for gain control is as follows.

As the AGC voltage applied to the base of transistor 110 goes more positive, the voltage at the emitter electrode of transistor 110 increases. This causes the diode 116 to conduct or to become forward biased. The DC current supplied via the diode 116 is returned to ground through the path afforded by inductor 113 and resistor 115. Therefore, the voltage at the emitter of transistor 94 is determined in part by this injected AGC current. Due to this current the transistor 94 conducts less. This therefore changes the transconductance of transistor 94 in a reverse AGC mode and hence serves to reduce the gain. However, since the current through transistor 94 decreases, even though the voltage at the emitter remains constant, the subsequent decrease in current results in the raising of the input impedance of the common base amplifier. This increase in input impedance therefore is reflected into mixer diode circuit 83 causing a change in the passband characteristics of the mixer diode circuit 83. However, it is noted that as diode 116 is caused to conduct harder because of the increase of the AGC voltage at the emitter electrode of transistor 110, the capacitor 114 as coupled through the diode impedance, serves to further bypass the junction between capacitor 86 and inductor 113. This action therefore tends to maintain the AC input impedance of transistor 94 constant during this AGC mode. The capacitor 114 further serves to bypass signal away from the amplifier and hence further gain reduction is afforded.

Due to the biasing of the base electrode of transistor 94, it is noted that the current through resistor 115 is maintained relatively constant. During AGC action the total current through resistor 115 is in part determined by the current flowing through diode 116 and in part by current through transistor 94. These currents are selected such that the voltage across resistor 115 during AGC operation is maintained relatively constant. Therefore, the interelectrode voltages across transistor 94 remain relatively fixed. The interelectrode reactances are therefore not disturbed from their quiescent value, thus assuring that the selective networks associated with transistor 94 will not be detuned during AGC operation.

It is also noted that the transistor 94 actually operates in a reverse AGC mode. The reverse AGC mode is defined by a decrease in collector current causing a decrease in amplifier gain. A reverse AGC mode is usually associated with nonlinearity and cross modulation products being developed in the amplifier stage. These effects are in part afforded by the fact that the interelectrode capacitances vary according to the changes of interelectrode voltages. By using the diode in determining the gain characteristic, one may take advantage of the diode response and provide reverse AGC without the usual accompanying distortions. In such a circuit the major portion of the AGC action is therefore accomplished by the diode, which for example at a 20db gain reduction will contribute 14db as compared to the 6db provided by the transistor.

Figure 2:
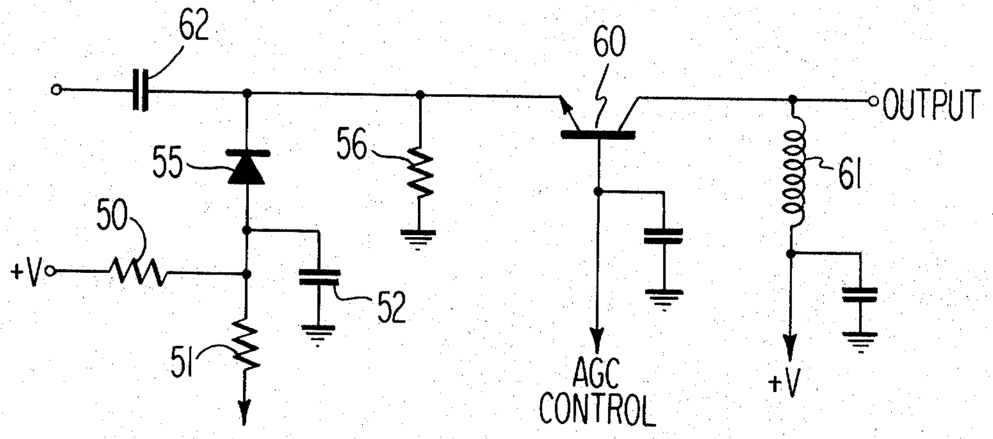
FIG. 2 is a schematic diagram of an alternate embodiment of a high frequency amplifier according to this invention.

Referring to FIG. 2, there is shown another embodiment of an amplifier which can be used at high frequencies in a reversed AGC mode. The amplifier configuration shown is similar to that shown in FIG. 1 with the exception that the bias on the diode is not varied and remains relatively fixed, as determined by the voltage divider coupled to the anode of the diode and comprising resistors 50 and 51. The junction between the two resistors 50 and 51 is shunted for AC to ground by means of capacitor 52. The cathode of the diode 55 is returned to ground via a resistor 56 which also provides a ground return for the emitter electrode of the common base transistor 60. The collector electrode of transistor 60 is coupled to a source of operating potential +V through an inductor 61. Signals are applied to the emitter electrode of transistor 60 via a capacitor 62.

Essentially, the circuit shown in FIG. 2 is similar to that in FIG. 1, and for example, the anode of the mixer diode 83 of FIG. 2 could be connected to the input of capacitor 62. The difference between the circuits is that in FIG. 2 the AGC control voltage is applied directly to the base electrode of transistor 60. To obtain a reverse AGC operation, the polarity of the control voltage would have to be changed. That is, to decrease the gain of the circuit, the control voltage would go negative to cause transistor 60 to conduct less current. Therefore, the voltage at the emitter of transistor 60 would tend to decrease. However, the decrease of voltage would cause the diode 55 to conduct, thus directing current through resistor 56 and thereby tending to maintain the voltage across resistor 56 constant with AGC control variations. As the AGC voltage at the base electrode of transistor 60 is increased, the voltage at the emitter would also increase, thus reverse biasing diode 55. However, the transistor 60 would be supplying more current under these conditions to maintain the voltage across resistor 56 at the predetermined value.

Thus the circuit shown in FIG. 2 with the appropriate control voltage applied to the base electrode of transistor 60 serves to maintain the low impedance at the input constant due to the conduction of the diode 55, which functions to insert capacitor 52 in shunt with the emitter electrode of the transistor. Therefore, the configuration shown in FIG. 2 has the advantages of that circuit shown in FIG. 1.

What is claimed is:

1. An amplifier comprising:

a transistor having base, emitter and collector electrodes, means connecting said transistor in a common base amplifier configuration including a signal input circuit coupled to said emitter electrode and an output circuit coupled to said collector electrode, said input circuit including a resistive element connected between said emitter electrode and a point of reference potential, a unilateral conducting device having a first terminal direct coupled to said emitter electrode of said transistor, means coupling a second terminal of said unilateral conducting device to said point of reference potential at signal frequencies, an automatic gain controlling direct current bias source, and means connecting said source of gain controlling direct current bias to said second terminal of said unilateral conducting device to cause the emitter current of said transistor to decrease and the unilateral conducting device current to increase with increases in automatic gain controlling direct current bias.

2. An amplifier comprising:

a transistor having base, emitter and collector electrodes, means connecting said transistor in a common base amplifier configuration including a signal input circuit coupled to said emitter electrode and an output circuit coupled to said collector electrode, said input circuit including a resistive element connected between said emitter electrode and a point of reference potential, a unilateral conducting device having a first terminal direct coupled to said emitter electrode of said transistor, means coupling said second terminal of said unilateral conducting device to said point of reference potential at signal frequencies includes a capacitor having low impedance to signal frequencies, an automatic gain controlling bias source, and means connecting said source of gain controlling bias to said second terminal of said unilateral conducting device to cause the emitter current of said transistor to decrease and the unilateral conducting device current to increase with increases in automatic gain controlling bias.

3. An amplifier as defined in claim 2 wherein said unilateral conducting device is poled to provide direct current through said resistive element in the same direction as the direct current from said emitter electrode.

4. An amplifier as defined in claim 2 wherein said input circuit is coupled to the mixer circuit of an ultra high frequency television tuner.

5. An amplifier comprising, a transistor having base, emitter and collector electrodes, means connecting said transistor in a common base amplifier configuration including a signal input circuit coupled to said emitter electrode and an output circuit coupled to said collector electrode, said signal input circuit including a resistive element connected between said emitter electrode and a point of reference potential, means providing a source of gain controlling direct current bias, unilateral conducting means connecting said source of gain controlling direct current bias to said emitter electrode and said resistive element, said unilateral conducting means poled to provide direct current through said resistive element in the same direction as direct current from said emitter electrode.

6. An amplifier as defined in claim 5 including means for biasing said unilateral conducting means to a condition of minimum conduction when said transistor is biased for maximum gain.

7. An amplifier as defined in claim 5 wherein said signal input circuit is coupled to a mixer circuit of a UHF television tuner.

8. An amplifier comprising, a transistor having base, emitter and collector electrodes, means connecting said transistor in a common base amplifier configuration including a signal input circuit coupled to said emitter electrode and an output circuit coupled to said collector electrode, said signal input circuit including a resistive element connected between said emitter electrode and a point of reference potential, means providing a source of gain controlling bias, unilateral conducting means connecting said source of gain controlling bias to said emitter electrode and said resistive element, said unilateral conducting means poled to provide direct current through said resistive element in the same direction as direct current from said emitter electrode, and a capacitor exhibiting low impedance to signal frequencies connected between the electrode of said unilateral conducting means remote from said emitter electrode and said point of reference potential.

* * * * *